US008957567B2

(12) United States Patent
Shu et al.

(10) Patent No.: US 8,957,567 B2
(45) Date of Patent: Feb. 17, 2015

(54) MECHANICAL DESIGN OF DEFORMATION COMPENSATED FLEXURAL PIVOTS STRUCTURED FOR LINEAR NANOPOSITIONING STAGES

(75) Inventors: Deming Shu, Darian, IL (US); Steven P. Kearney, Westchester, IL (US); Curt A. Preissner, Chicago, IL (US)

(73) Assignee: UChicago Argonne, LLC, Chicago, IL (US)

( * ) Notice: Subject to any disclaimer, the term of this patent is extended or adjusted under 35 U.S.C. 154(b) by 424 days.

(21) Appl. No.: 13/593,799

(22) Filed: Aug. 24, 2012

(65) Prior Publication Data
US 2014/0055005 A1 Feb. 27, 2014

(51) Int. Cl.
*H02N 2/04* (2006.01)
*H01L 41/083* (2006.01)
*H01L 41/09* (2006.01)

(52) U.S. Cl.
CPC .............. *H01L 41/083* (2013.01); *H01L 41/09* (2013.01)
USPC ........................ 310/328; 310/311; 310/323.02

(58) Field of Classification Search
CPC .... H01L 41/083; H01L 41/09; H01L 41/0926
USPC ..................... 310/311, 323.02, 328
See application file for complete search history.

(56) References Cited

U.S. PATENT DOCUMENTS

| 5,526,903 | A | 6/1996 | Shu et al. | |
|---|---|---|---|---|
| 5,896,200 | A | 4/1999 | Shu et al. | |
| 6,607,840 | B2 | 8/2003 | Shu et al. | |
| 6,984,335 | B2 | 1/2006 | Shu et al. | |
| 7,597,475 | B1 * | 10/2009 | Shu et al. | 378/205 |
| 7,994,688 | B2 * | 8/2011 | Shu et al. | 310/328 |
| 8,089,199 | B2 | 1/2012 | Shu et al. | |
| 8,314,533 | B2 * | 11/2012 | Higashionji et al. | 310/323.09 |
| 2009/0023607 | A1 * | 1/2009 | Rozhok et al. | 506/30 |

OTHER PUBLICATIONS

"Considerations in the Application of Flexural Pivots" by H. Troeger, Automatic Control Data Systems Engineering, vol. 17 No. 4 Nov. 1962.
Technical Data, C-Flex Bearing Company, Inc. of Frankfort, New York 13340 USA, http://www.c-flex.com, pp. 1-8.
"Analytical and experimental characterisation of high-precision flexural pivots subjected to lateral loads" by S. Zelenika and F. De Bona, Precision Engineering, 26 (2002) 381-388.

* cited by examiner

*Primary Examiner* — Derek Rosenau
*Assistant Examiner* — Bryan Gordon
(74) *Attorney, Agent, or Firm* — Joan Pennington

(57) ABSTRACT

A method and deformation compensated flexural pivots structured for precision linear nanopositioning stages are provided. A deformation-compensated flexural linear guiding mechanism includes a basic parallel mechanism including a U-shaped member and a pair of parallel bars linked to respective pairs of I-link bars and each of the I-bars coupled by a respective pair of flexural pivots. The basic parallel mechanism includes substantially evenly distributed flexural pivots minimizing center shift dynamic errors.

20 Claims, 16 Drawing Sheets

FIG. 6B

```
┌─────────────────────────┐     ┌─────────────────────────┐     ┌─────────────────────────┐
│ MEASURE AND ANALYZE     │     │ SELECTIVELY MATCH       │     │ INSTALL FLEXURAL PIVOTS │
│ STRUCTURE OF EACH       │     │ FLEXURAL PIVOTS FOR     │     │ USING SET SCREWS IN     │
│ FLEXURAL BEARING OR     │     │ ASSEMBLY IN DEFORMATION │     │ DEFORMATION COMPENSATED │
│ PIVOT 606 (CROSS-       │────▶│ COMPENSATED FLEXURAL    │────▶│ FLEXURAL PIVOT-BASED    │
│ SPRING FLEXURAL PIVOT), │     │ PIVOT-BASED PARALLEL    │     │ PARALLEL MECHANISM 102  │
│ IDENTIFY CENTER SHIFT   │     │ MECHANISM 102 PROVIDE   │     │          624            │
│ ERROR NUMBERS (IDENTIFY │     │ EVENLY DISTRIBUTED      │     └─────────────────────────┘
│ DIMENSIONS, GEOMETRY,   │     │ FLEXURAL PIVOTS         │
│ X,Y DISPLACEMENTS OR    │     │ COMPENSATING FOR CENTER │
│ SHIFTS BETWEEN          │     │ SHIFT ERRORS (FINE      │
│ GEOMETRIC CENTER OF     │     │ TUNING OF EACH FLEXURAL │
│ NEUTRAL AND ROTATION    │     │ PIVOT, PAIRING OF       │
│ POSITIONS)              │     │ FLEXURAL PIVOTS, AND    │
│          620            │     │ OPTIMIZING OF           │
└─────────────────────────┘     │ ORIENTATION OF EACH     │
                                │ FLEXURAL PIVOT)         │
                                │          622            │
                                └─────────────────────────┘
```

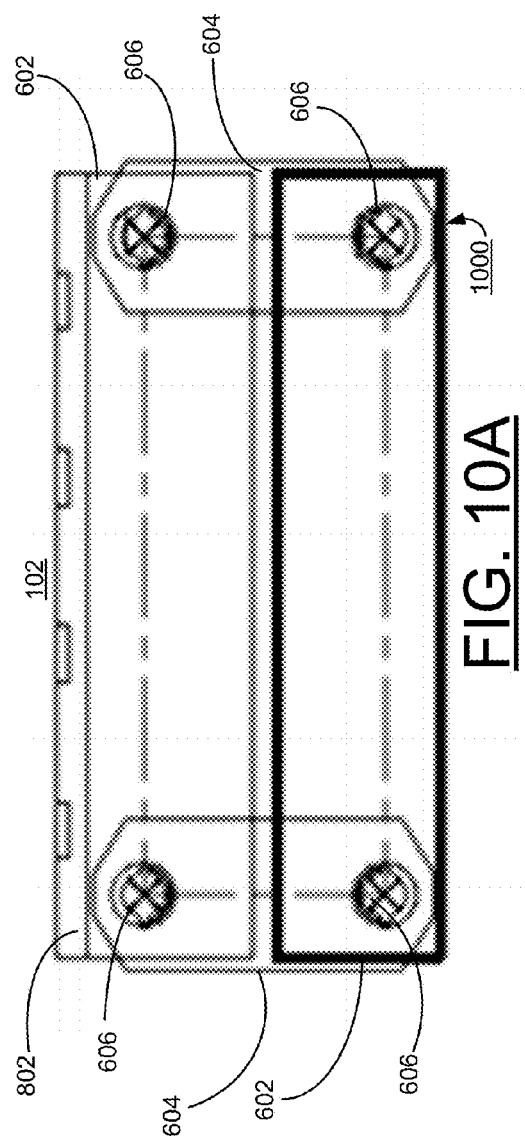
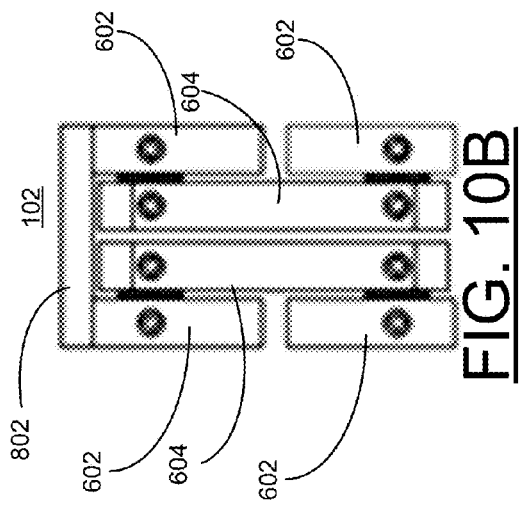

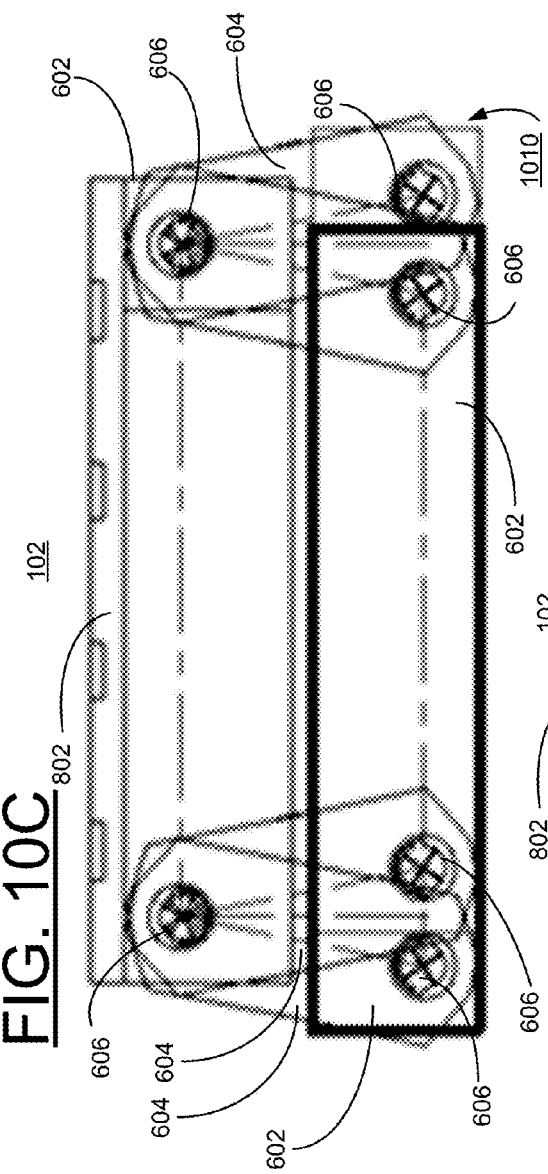

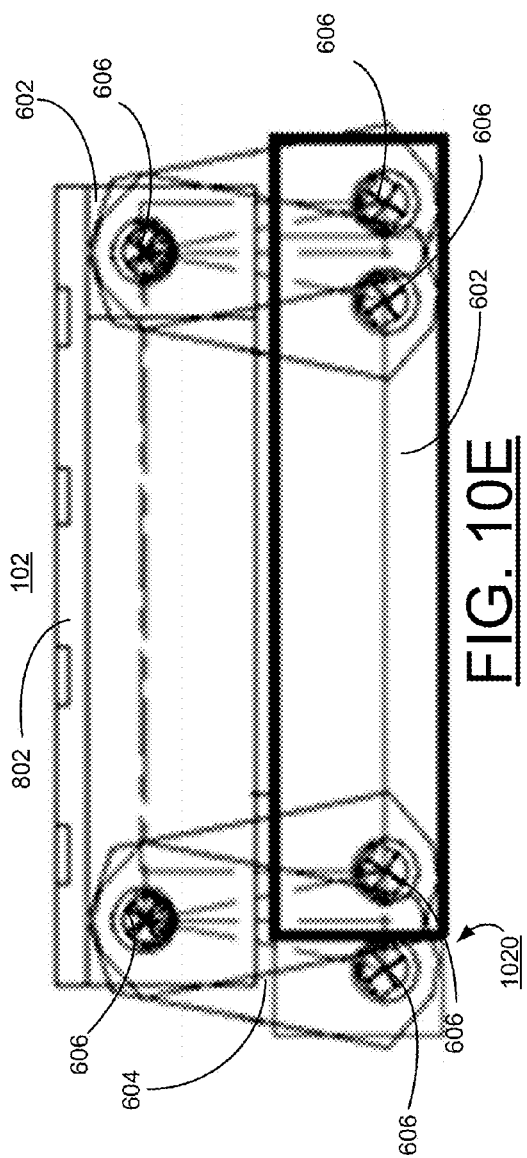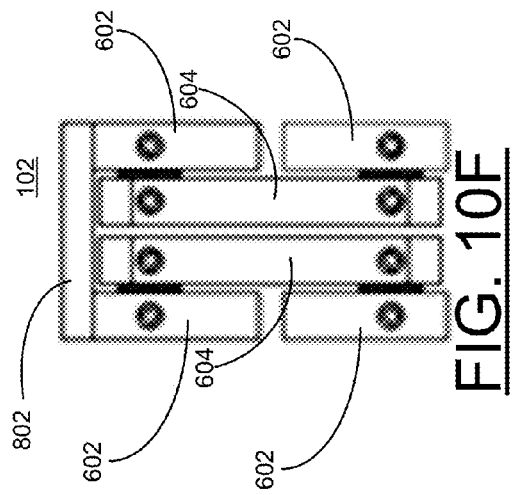

MECHANICAL DESIGN OF DEFORMATION COMPENSATED FLEXURAL PIVOTS STRUCTURED FOR LINEAR NANOPOSITIONING STAGES

CONTRACTUAL ORIGIN OF THE INVENTION

The United States Government has rights in this invention pursuant to Contract No. DE-ACO2-06CH11357 between the United States Government and UChicago Argonne, LLC representing Argonne National Laboratory.

FIELD OF THE INVENTION

The present invention relates generally to precision positioning stage systems, and more particularly, relates to a method and deformation compensated flexural pivots structured for linear nanopositioning stages.

DESCRIPTION OF THE RELATED ART

Recently, there are more synchrotron radiation instrument applications that require a very high reproducibility for multidimensional linear positioning systems with nanometer or sub-nanometer resolution. In the travel range of less than a few hundred microns, commercial PZT-driven flexural linear stages are available.

Commercial-precision ball-bearing-based or roller-bearing-based linear positioning stages are capable of providing a much larger travel range. However, their positioning resolution is limited by the friction of the bearing-based guiding system. Moreover, their linear motion straightness of trajectory usually is not repeatable due to the roundness errors of the bearings rolling element and the uncertainty of the rolling ball or roller sliding effect.

U.S. Pat. No. 7,994,688 by Deming Shu and Jorg M. Maser and assigned to the present assignee discloses a novel mechanical design for laminar weak-link mechanisms with centimeter-level travel range and sub-nanometer positioning resolution. An enhanced mechanical design for laminar weak-link mechanisms with centimeter-level travel range and sub-nanometer positioning resolution is provided. A multiple parallelogram weak-link structure includes a predefined pattern of a plurality of perpendicularly arranged groups of connecting links, each link having at least one pair of weak-link connections. Each of the plurality of perpendicularly arranged groups includes a terminal for mounting to a fixed base. The multiple parallelogram weak-link structure includes a moving part for mounting on a carriage, providing precisely controlled movement with stability in one direction. A two-dimensional (2D) ultra-precision scanning stages assembly for x-ray nanoprobe applications includes multiple redundantly constrained weak-link structures, a vertical ultra-precision positioning stage, and a horizontal ultra-precision positioning stage.

Linear flexural stages have been developed at the Advanced Photon Source (APS) at Argonne National Laboratory (ANL) including laminar weak-link mechanisms manufactured in accordance with the disclosure and teachings of the above identified U.S. Pat. No. 7,994,688 with 3-mm travel range using fishbone-shaped multiple parallelogram weak-link structures.

It is desirable to provide improved deformation compensated flexural pivots structured for precision linear nanopositioning stages capable of providing a large travel range.

It is desirable to provide such improved deformation compensated flexural pivots structured for precision linear nanopositioning stages enabling, for example, a travel range of 6-12 mm.

It is desirable to provide such improved deformation compensated flexural pivots structured for precision linear nanopositioning stages enabling sub-nanometer positioning resolution, high tilting stiffness, and microradian-level straightness of trajectory repeatability.

SUMMARY OF THE INVENTION

Principal aspects of the present invention are to provide a method and deformation compensated flexural pivots structured for precision linear nanopositioning stages. Other important aspects of the present invention are to provide such method and deformation compensated flexural pivots structured for precision linear nanopositioning stages substantially without negative effect and that overcome some of the disadvantages of prior art arrangements.

In brief, a method and deformation compensated flexural pivots structured for precision linear nanopositioning stages are provided. A deformation-compensated flexural linear guiding mechanism includes a basic parallel mechanism including a U-shaped member and a pair of parallel bars linked to respective pairs of I-link bars and each of the I-bars coupled by a respective pair of flexural pivots. The basic parallel mechanism includes substantially evenly distributed flexural pivots minimizing center shift dynamic errors.

In accordance with features of the invention, center shift dynamic errors of each flexural pivot are analyzed before the assembly process. The assembly process includes fine tuning of each flexural pivot, pairing of flexural pivots, and optimizing of the orientation of each flexural pivot.

In accordance with features of the invention, the precision flexural linear stage enables sub-nanometer positioning resolution, high tilting stiffness, and microradian-level straightness of trajectory repeatability.

In accordance with features of the invention, three sets of deformation-compensated flexural linear guiding mechanisms are applied on a precision linear nanopositioning stage. Two sets of the linear guiding mechanisms are mounted vertically between a stage base and a single stage carriage to provide the stage vertical load capacity. One set of the linear guiding mechanism links the stage base and the stage carriage horizontally to enhance the stage linear guiding and provide lateral stiffness.

In accordance with features of the invention, synchronizing linkages are provided between the U-shaped member or middle bars of the three sets of guiding mechanisms to integrate the three sets of guiding mechanisms into a one-stage guiding system.

In accordance with features of the invention, the precision linear nanopositioning stage includes a PZT motor mounted on the stage base and a PZT actuator mounted on the stage carriage. The PZT motor provides 12-mm travel range with 100-nm resolution, and the PZT actuator drives the stage with sub-nanometer positioning resolution in a 15-micron travel range. A set of compression springs provides the preloading force between the PZT motor and the PZT actuator to minimize the motion backlash.

In accordance with features of the invention, a grating optical encoder with 5-nm resolution measures the stage carriage position related to the stage base. To control the stage with 10-nm closed-loop resolution in a 12-mm travel range, a coarse-to-fine strategy is realized by motion relay between the PZT motor and the PZT actuator.

In accordance with features of the invention, for applications with nanometer- or sub-nanometer-level positioning, a laser interferometer with sub-nanometer resolution optionally is used for the closed-loop positioning control.

BRIEF DESCRIPTION OF THE DRAWINGS

The present invention together with the above and other objects and advantages may best be understood from the following detailed description of the preferred embodiments of the invention illustrated in the drawings, wherein:

FIG. 6B is a flow chart illustrating exemplary operation of a process for manufacturing the deformation-compensated flexural linear guiding mechanism of 1, 2, 3, 4, 5A, 5B, and 6A in accordance with preferred embodiments;

FIGS. 10A, 10B, 10C, 10D, 10E, and 10F illustrate example operations of the deformation-compensated flexural linear guiding mechanism of FIGS. 1, 2, 3, 4, 5A, and 5B and FIGS. 6, 7, 8, and 9 in accordance with preferred embodiments;

DETAILED DESCRIPTION OF THE PREFERRED EMBODIMENTS

Figure 1:
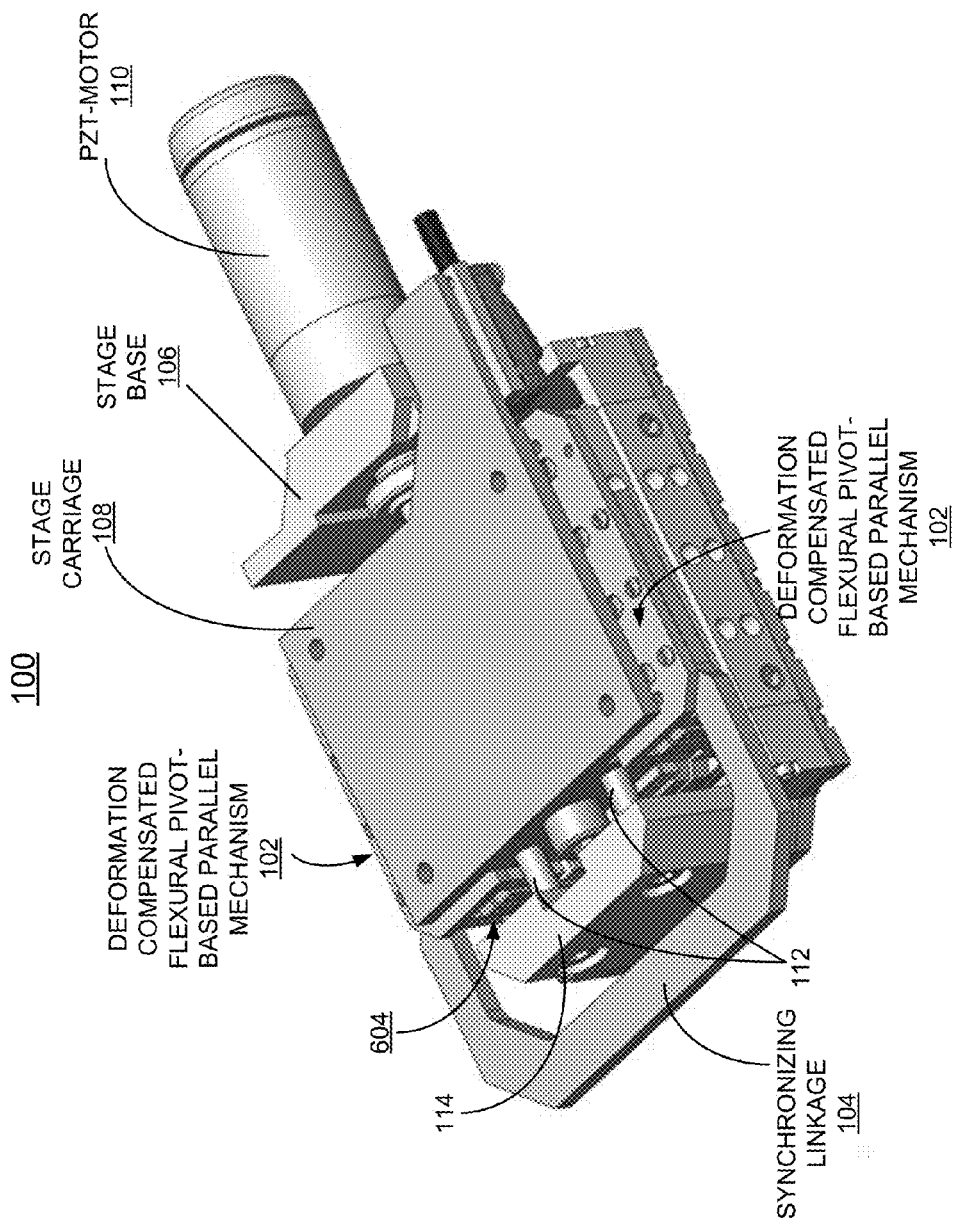
FIGS. 1, 2, 3, 4, 5A, and 5B schematically illustrate not to scale an example precision linear nanopositioning stage including three sets of deformation-compensated flexural linear guiding mechanisms in accordance with a preferred embodiment.

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and deformation compensated flexural pivots structured for precision linear nanopositioning stages are provided.

Having reference now to the drawings, in FIGS. 1, 2, 3, 4, 5A, and 5B, there is shown an example precision linear nanopositioning stage generally designated by the reference character 100 including three sets of deformation-compensated flexural linear guiding mechanisms each generally designated by the reference character 102 in accordance with the preferred embodiment.

In accordance with features of the invention, the precision linear nanopositioning stage 100 including novel ultra-precision deformation-compensated flexural pivot mechanisms 102 enables sub-nanometer positioning resolution, high tilting stiffness, and microradian-level straightness of trajectory repeatability. This performance is not possible with a conventional simple rolling element guiding system.

The precision linear nanopositioning stage 100 includes a synchronizing linkage 104 coupled between two deformation-compensated flexural linear guiding mechanism 102 that are mounted vertically between a stage base 106 and the stage carriage 108 to provide the stage vertical load capacity. The precision linear nanopositioning stage 100 includes one deformation-compensated flexural linear guiding mechanism 102 that links the stage base 106 and the stage carriage 108 horizontally to enhance the stage linear guiding and provide lateral stiffness. The precision linear nanopositioning stage 100 includes a piezoelectric transducer (PZT) or PZT-based motor 110 mounted on the stage base 106.

Figure 2:
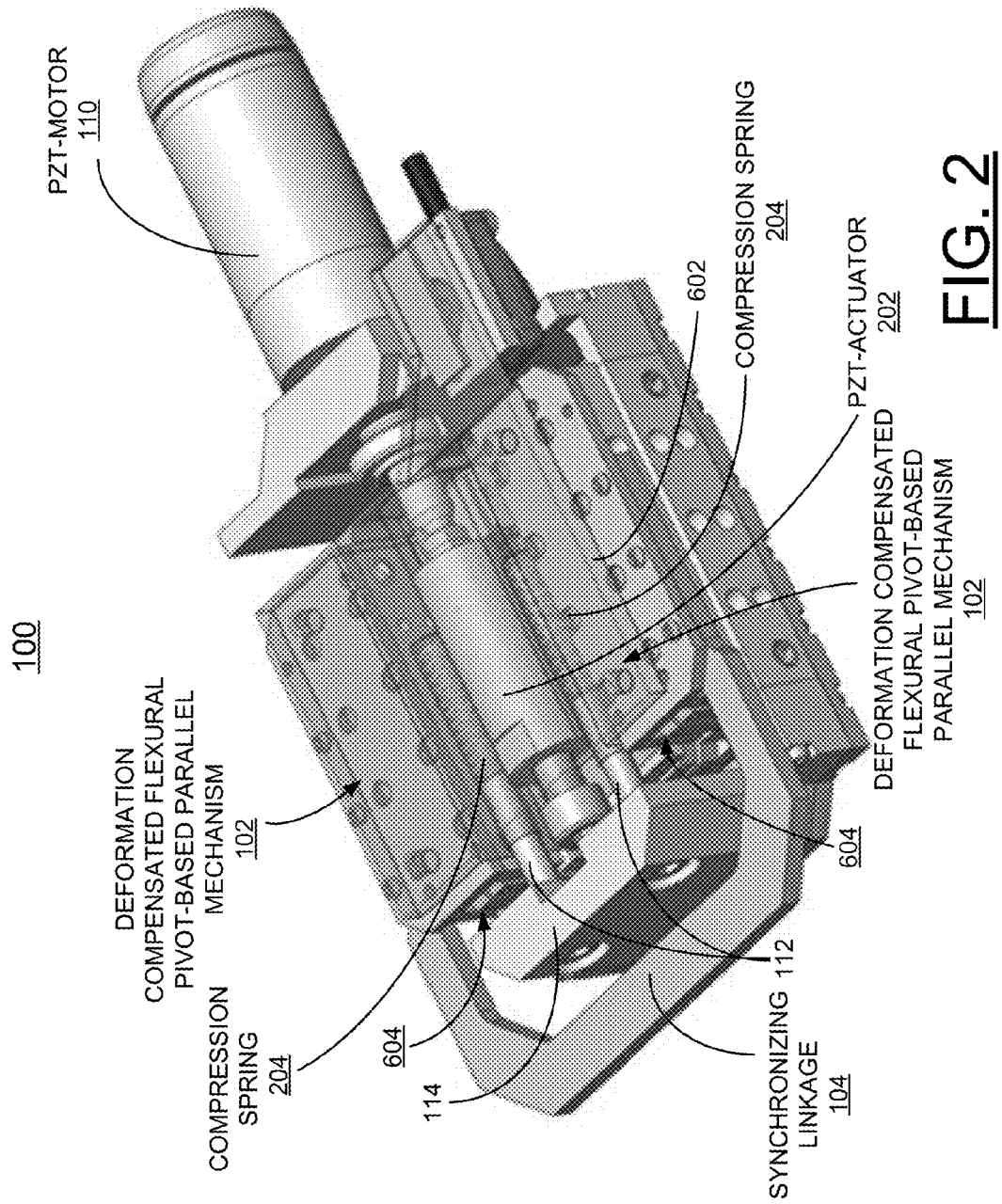
Figure 3:
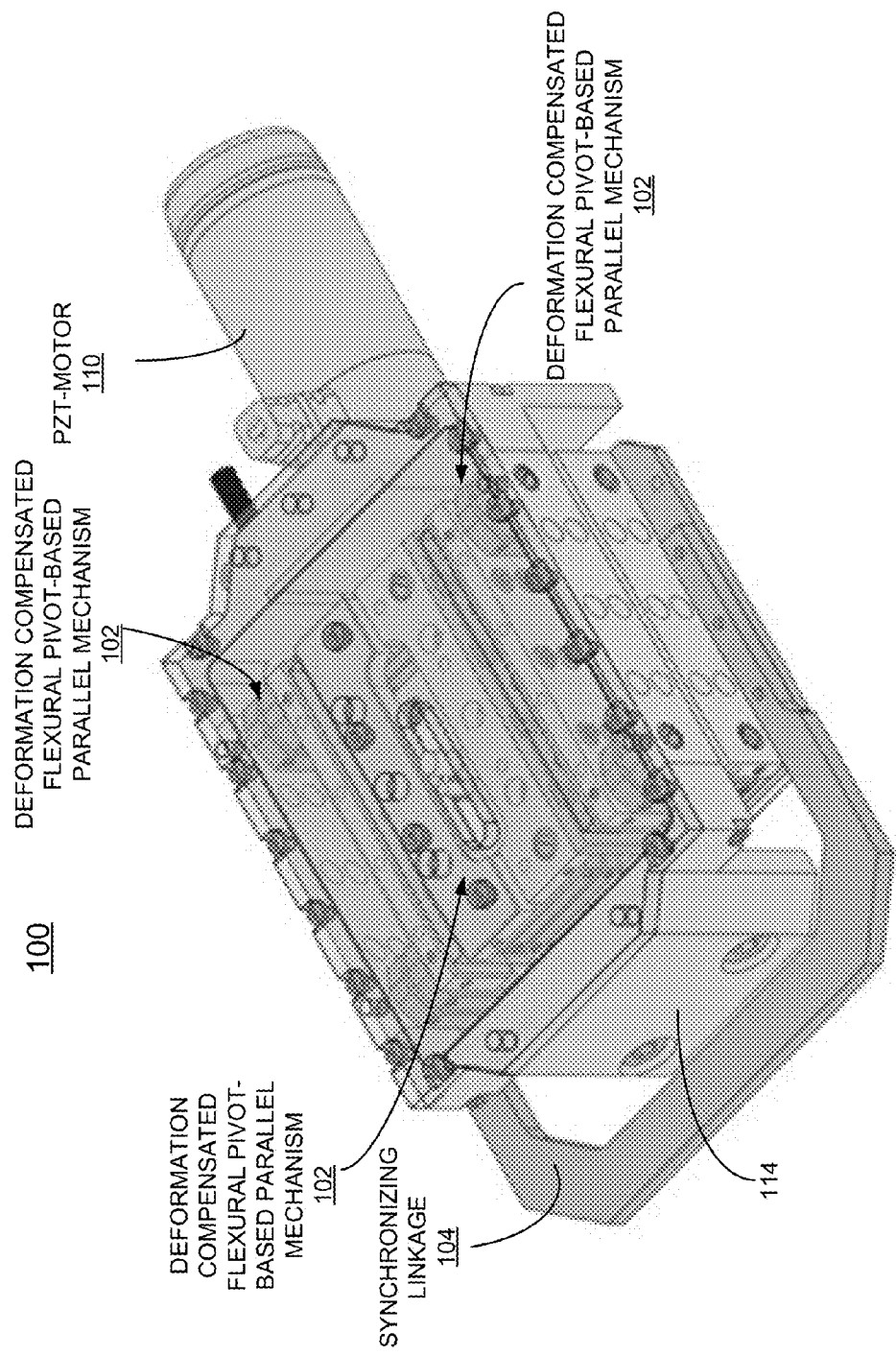
Figure 4:
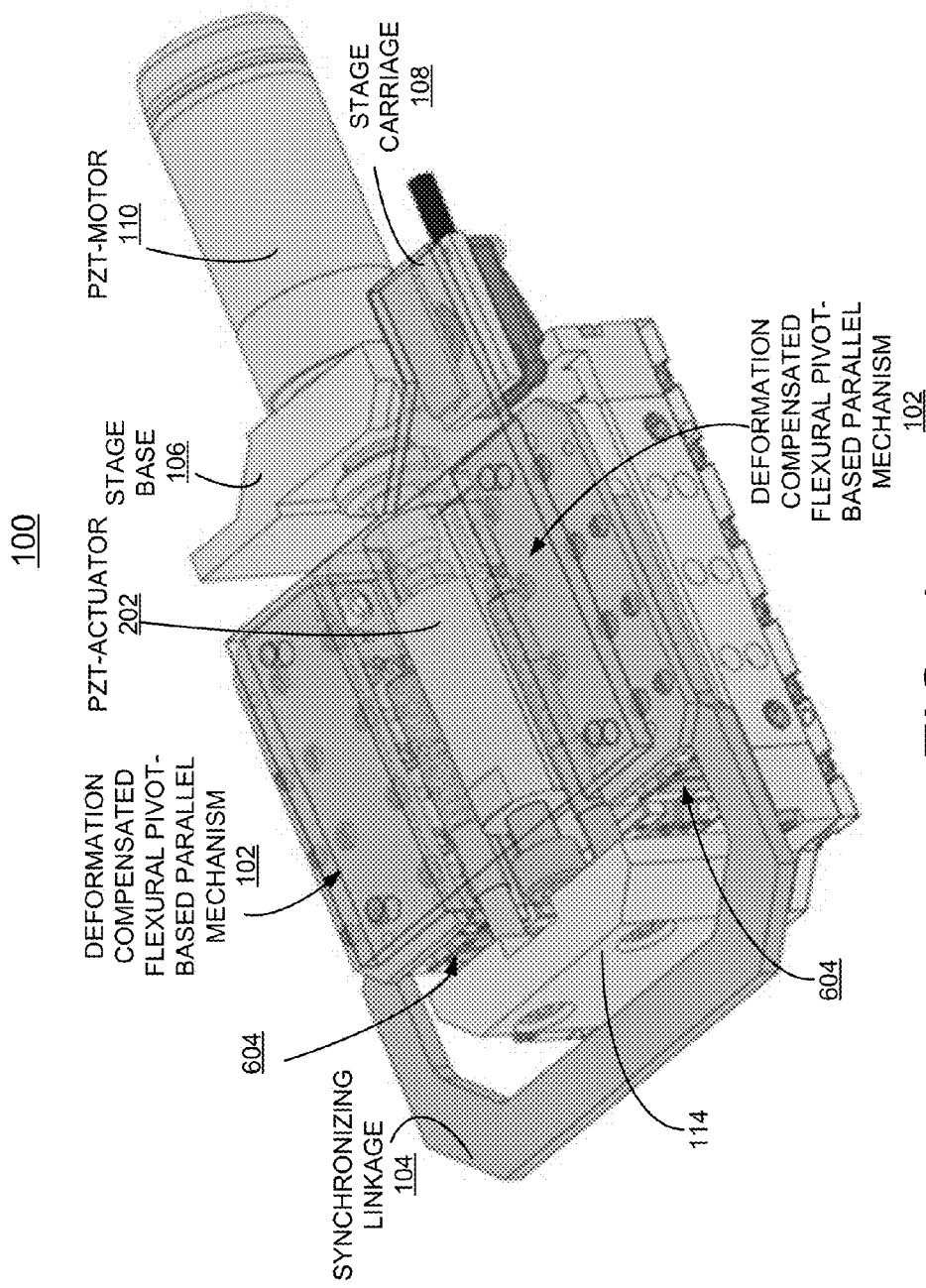
Figure 5A:
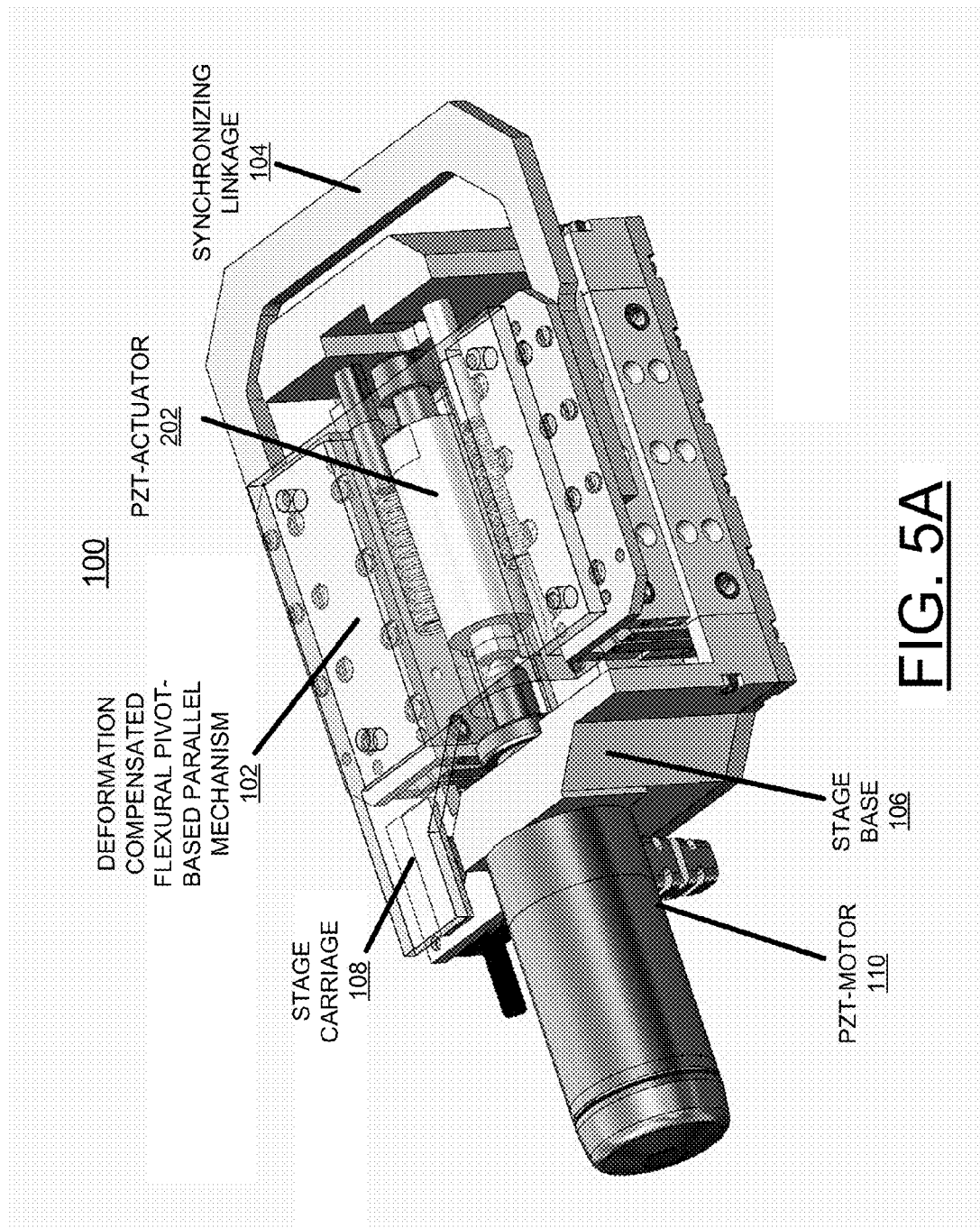

As shown in FIGS. 2, 4, 5A, the precision linear nanopositioning stage 100 includes a PZT actuator 202 mounted on the stage base 106. The PZT actuator 202 provides 12-mm travel range with 100-nm resolution, and the PZT motor 110 drives the stage with sub-nanometer positioning resolution in a 15-micron travel range. The PZT actuator 202 and the PZT motor 110 are commercially available devices, such as manufactured and sold by PI GmbH and Company. It should be understood that other linear drivers, such as a stepping-motor-driven linear driver with a PZT actuator can provide the required driving force for the precision linear nanopositioning stage 100.

A set of compression springs 204 coupled by members 112 to a stage member 114 provides preloading force between the PZT actuator 202 and the PZT motor 110 to minimize the motion backlash from a driving force operation of the linear nanopositioning stage 100.

Figure 5B:
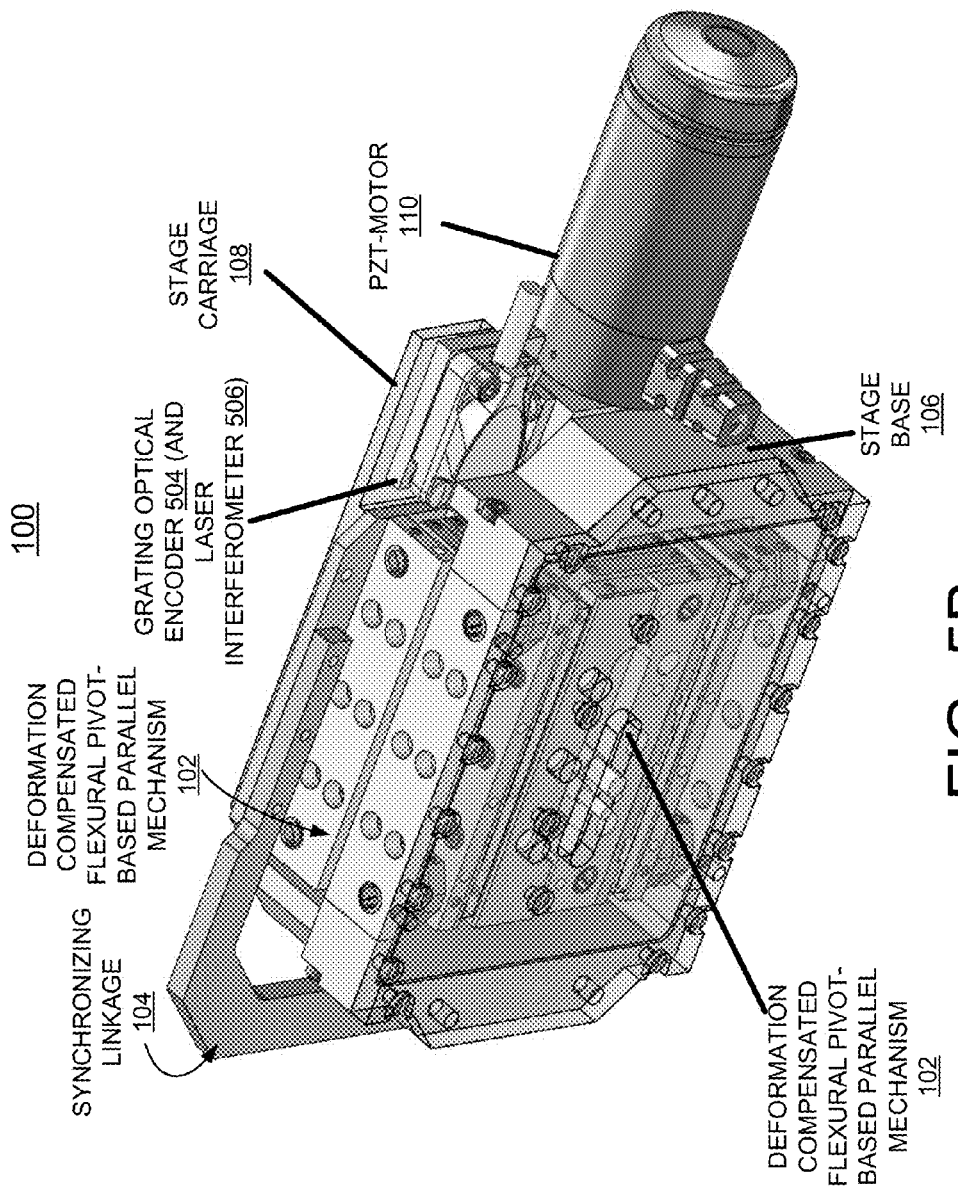
Figure 6A:
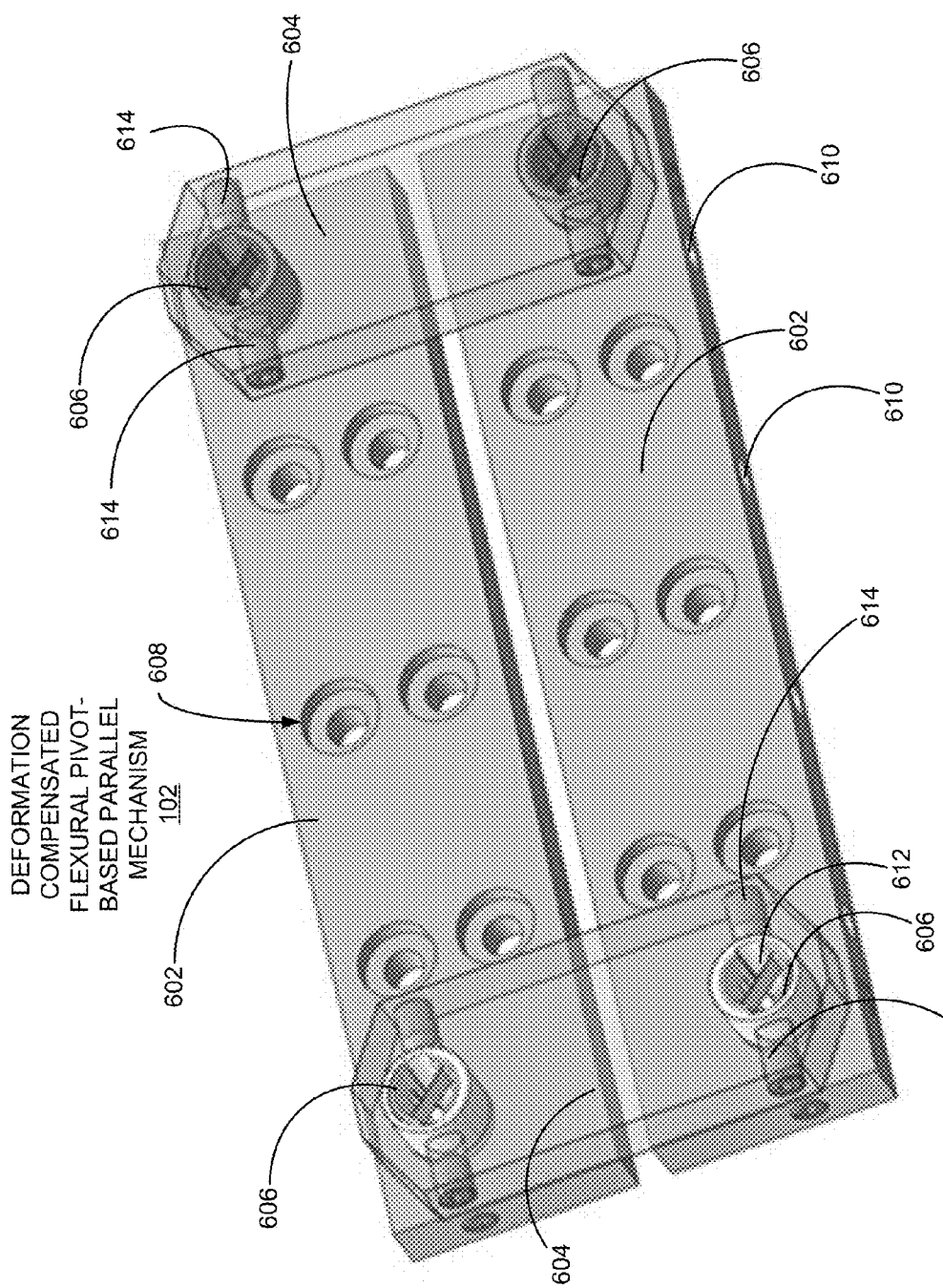
FIG. 6A schematically illustrates not to scale an example deformation-compensated flexural linear guiding mechanism of 1, 2, 3, 4, 5A, and 5B in accordance with preferred embodiments.
Figure 7:
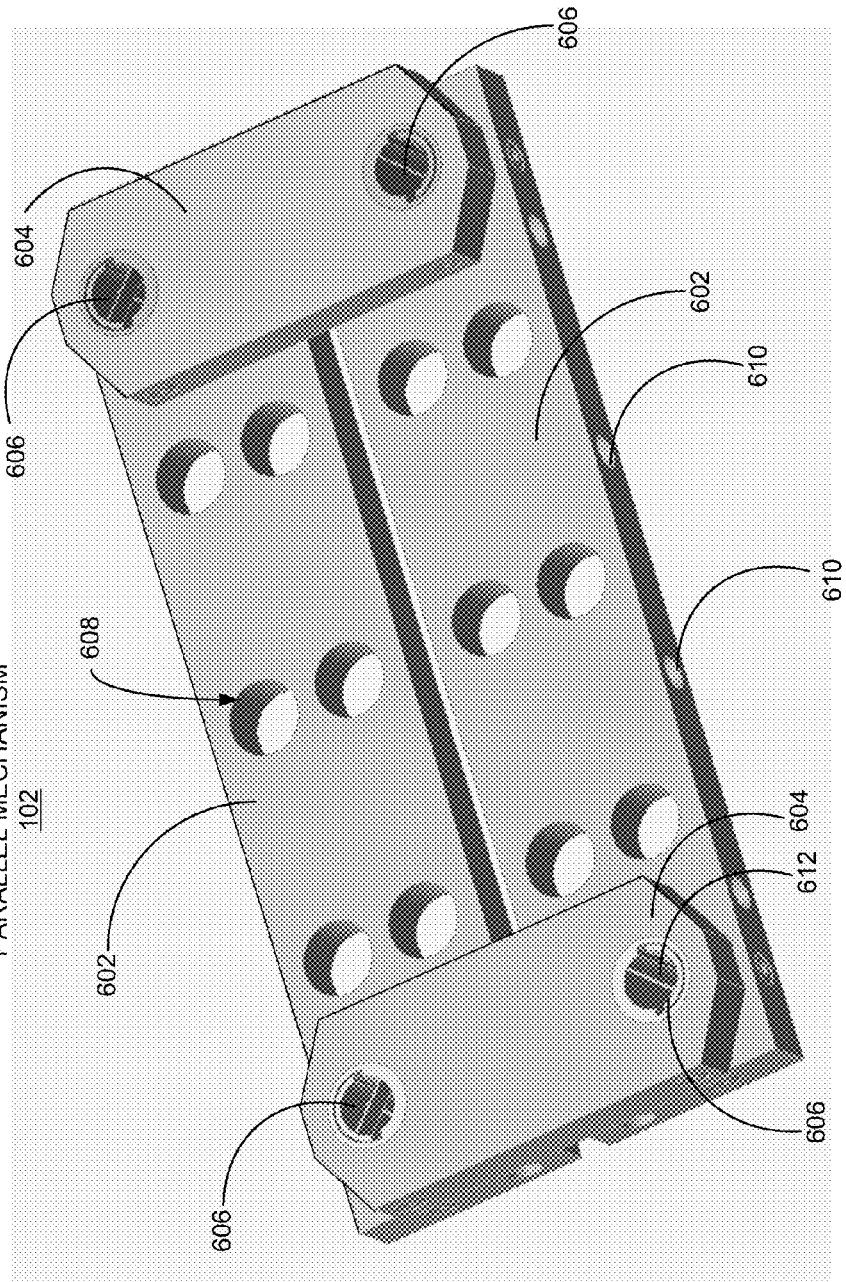
FIGS. 7, 8, and 9 further schematically illustrate not to scale the example deformation-compensated flexural linear guiding mechanism of 1, 2, 3, 4, 5A, 5B, and 6A in accordance with preferred embodiments.

As shown in FIG. 5B, in accordance with features of the invention, a grating optical encoder 504, for example, with 5-nm resolution measures the position of the stage carriage 108 related to the stage base 106. To control the stage with 10-nm closed-loop resolution in a 12-mm travel range, a coarse-to-fine strategy is realized by motion relay between the PZT actuator 202 and the PZT motor 110. For applications with nanometer- or sub-nanometer-level positioning, a laser interferometer 506 with sub-nanometer resolution optionally is used for the closed-loop positioning control.

For example, the grating optical encoder 504 is implemented with a 3500 Si grating optical encoder with 5-nm resolution from MicroE Systems of Bedford, Mass. 01730 USA or the laser interferometer 506 is implemented with a Renishaw and Sios laser interferometer system from Renishaw Inc., Hoffman Estates, Ill. 60192 72A.

In accordance with features of the invention, the precision linear nanopositioning stage 100 has, for example, a travel range of 6-12 mm, load capacity of 1-2 kg, and dimensions within 150 (L)×75 (W)×33 (H) mm. The travel range and load capacity of the precision linear nanopositioning stage 100 varies with different types of flexural pivots 606 that are installed.

Referring to FIGS. 6A, 7, 8, and 9, there is shown an example deformation-compensated flexural linear guiding mechanism 102 in accordance with preferred embodiments. The deformation-compensated flexural linear guiding mechanism 102 includes a basic parallel mechanism including a plurality of parallel bars 602 and a middle bar 802 shown in FIGS. 8 and 9, forming a U-shaped member 803 with adjacent bars 602, with the plurality of parallel bars 602 linked to respective pairs of I-link bars 604.

Figure 8:
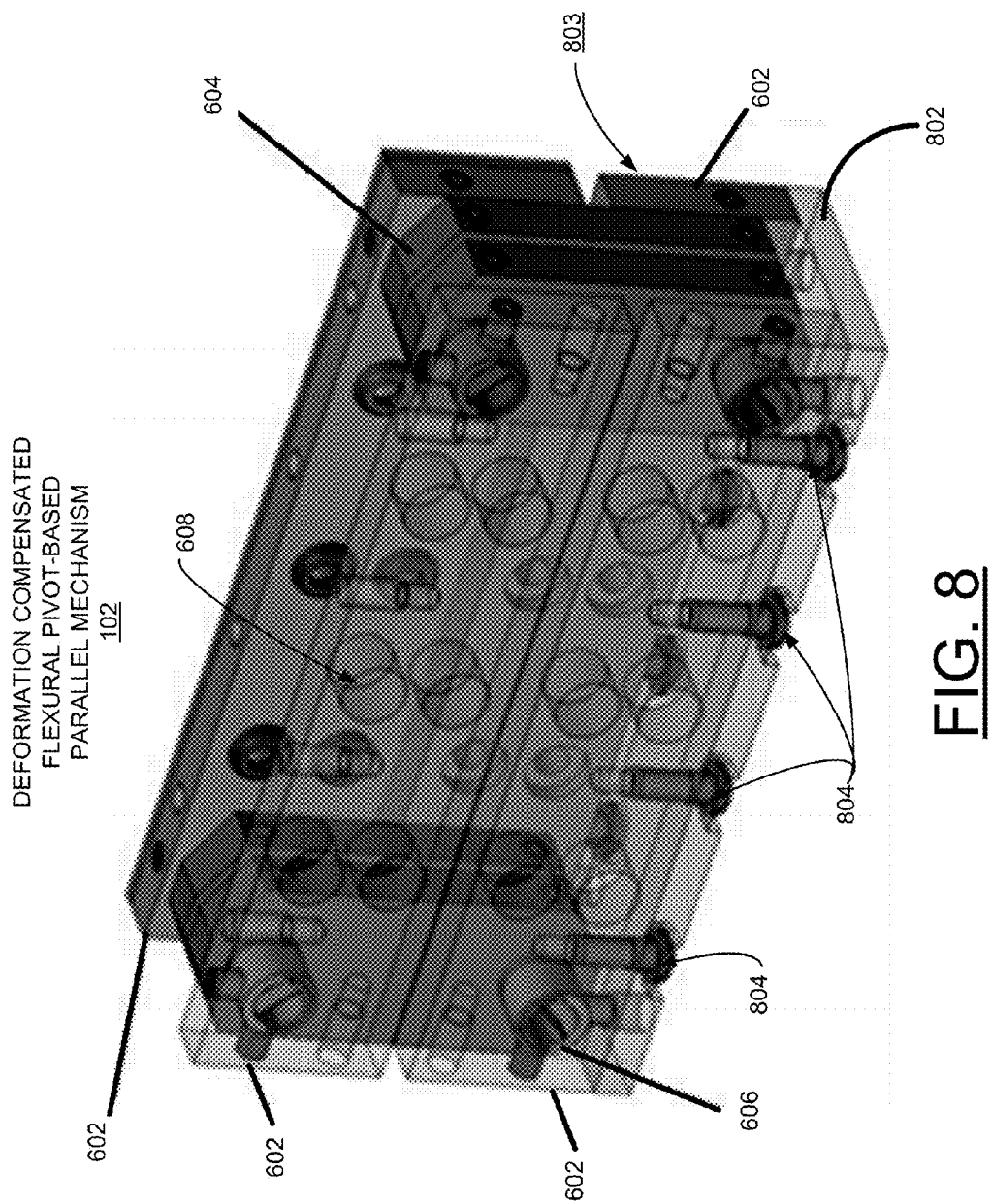
Figure 9:
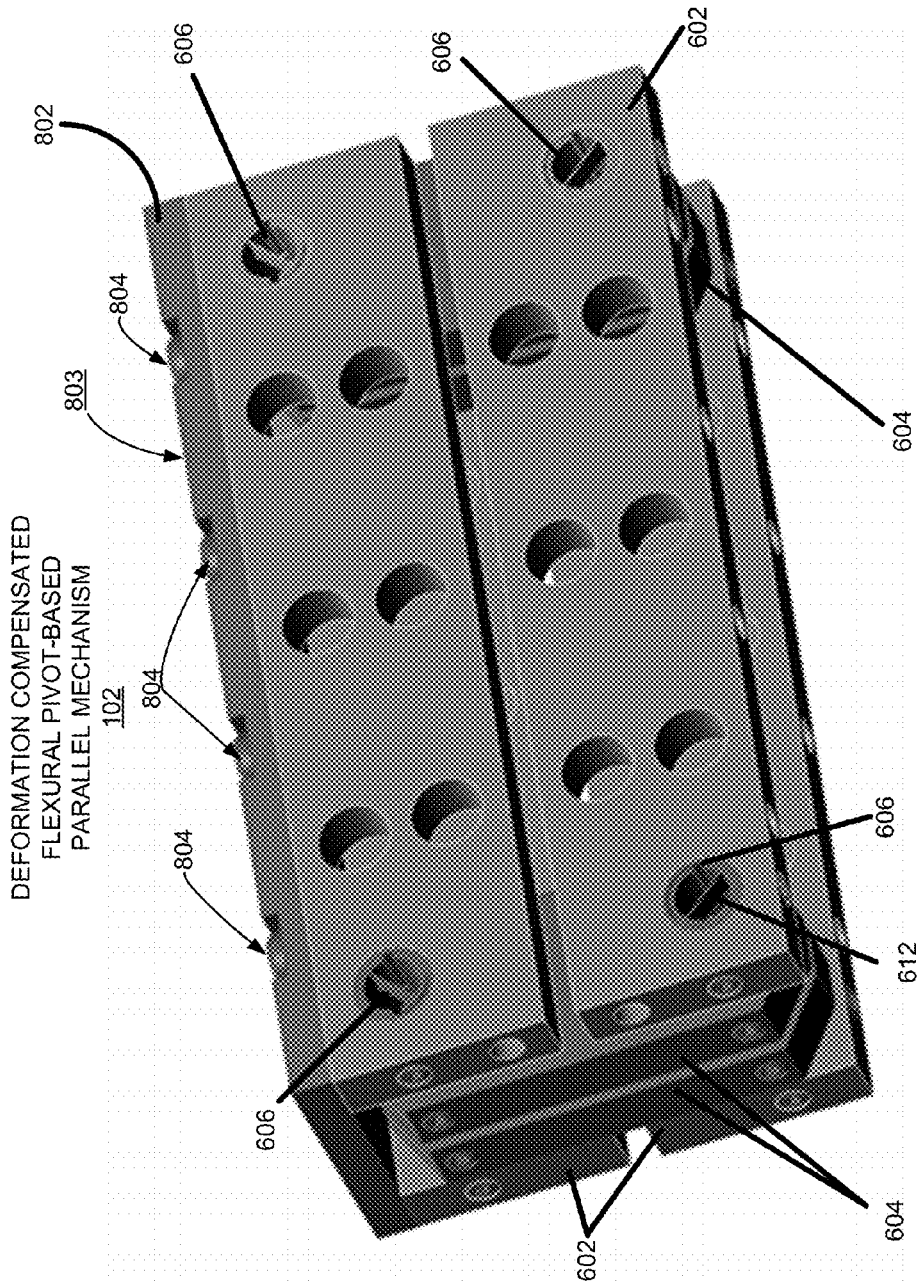

Each of the I-link bars 604 is coupled to the associated parallel bar and U-shaped middle bar by a respective pair of flexural pivots 606 in accordance with preferred embodiments. Each of the flexural pivots 606 is a precision flexural pivot, such as manufactured and sold by C-Flex Bearing Company, Inc. (http//www.c-flex.com) of Frankfort, N.Y. 13340 USA. The parallel bars 602 include a plurality of openings 608 spaced apart along the length of the bar and a plurality of openings 610 spaced apart along the side edge of the bar. A plurality of mounting screws or fasteners 804 shown in FIGS. 8 and 9, are received in openings 610 defining the U-shaped member 803.

In accordance with features of the invention, the basic parallel mechanism 102 includes substantially evenly distributed flexural pivots 606 minimizing center shift dynamic errors.

In the deformation-compensated flexural linear guiding mechanism 102, each of the flexural pivots 606 includes integrated bisymmetrical pivot spring members 612 and one or more associated set screws 614. Each of the flexural pivots 606 is frictionless and does not require lubrication, avoiding rolling error of conventional sliding and rolling bearings.

Referring also to FIG. 6B, there are shown exemplary operations of a process for manufacturing the deformation-compensated flexural linear guiding mechanism 102 in accordance with preferred embodiments. As indicated at a block 620, center shift dynamic errors of each flexural pivot 606 are measured and the structure of each flexural pivot 602 is analyzed before the assembly process. The assembly process includes fine tuning of each flexural pivot 606, selectively pairing of flexural pivots, and optimizing of the orientation of each flexural pivot as indicated at a block 624. At block 624, the fine tuning of each flexural pivot 606 includes, for example, adjustment or material removal from the spring members 612, selectively pairing of the flexural pivots 606 includes, for example, sorting by X and Y directional center shift dynamic error numbers adjusting respective error shift in opposite direction for the selectively paired flexural pivots 606, and precisely providing orientation of each flexural pivot 606.

FIGS. 10A, and 10B, 10C, and 10D, and 10E, and 10F, respective side views of the deformation-compensated flexural linear guiding mechanism 102 are provided; illustrating example operations of the deformation-compensated flexural linear guiding mechanism 102 in accordance with preferred embodiments.

In FIGS. 10A, and 10B the deformation-compensated flexural linear guiding mechanism 102 is shown in an initial position generally designated by the reference character 1000 with an initial orientation of the flexural pivots 106 in FIG. 10A.

In FIGS. 10C, and 10D the deformation-compensated flexural linear guiding mechanism 102 is shown in the initial position with the initial orientation of the flexural pivots 106, and rotated to a second travel position generally designated by the reference character 1010 in FIG. 10C.

In FIGS. 10E, and 10F the deformation-compensated flexural linear guiding mechanism 102 is shown in the initial position with the initial orientation of the flexural pivots 106, and rotated to a third travel position generally designated by the reference character 1020 in FIG. 10E in the opposite direction from the second travel position.

In accordance with features of the invention, synchronizing linkages are provided between the U-shaped member 803 of the three guiding mechanisms 102 to integrate the three guiding mechanisms into a single one-stage guiding system 100.

Figure 11:
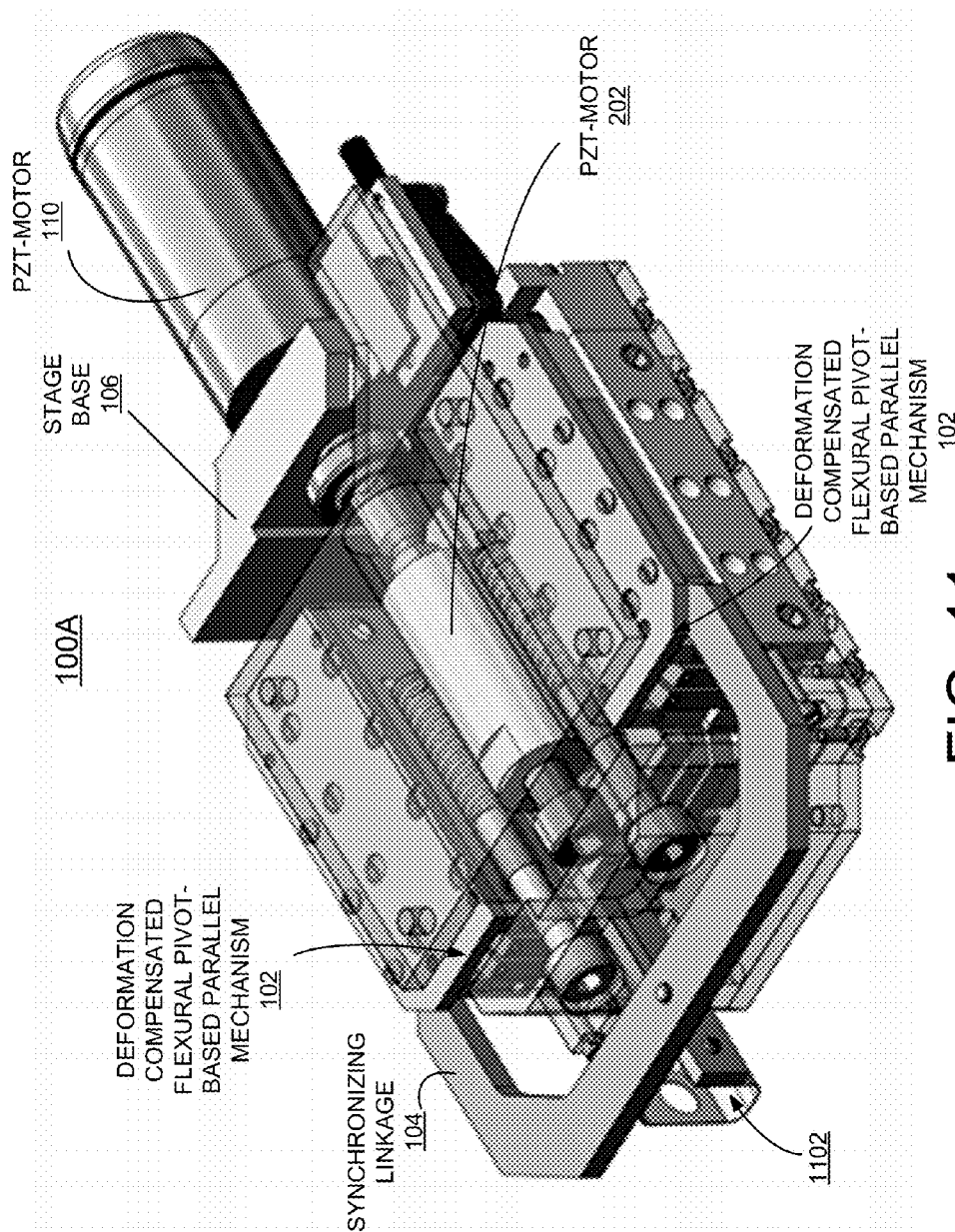
FIGS. 11 and 12 illustrate schematically illustrate not to scale another example precision linear nanopositioning stage including three sets of deformation-compensated flexural linear guiding mechanisms in accordance with a preferred embodiment.
Figure 12:
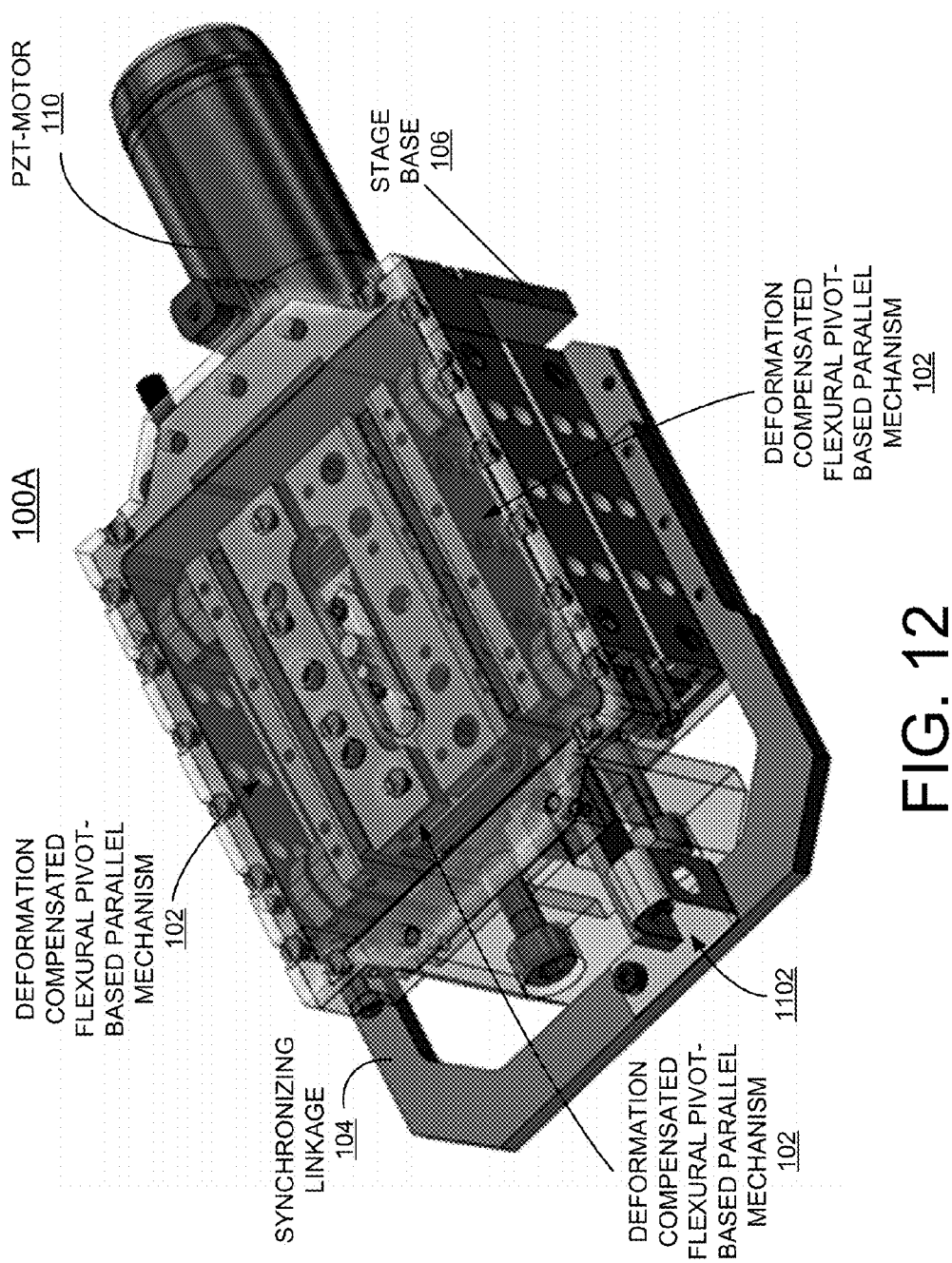

FIGS. 11 and 12 schematically illustrate not to scale another example precision linear nanopositioning stage 100A including three sets of deformation-compensated flexural linear guiding mechanisms 102 in accordance with a preferred embodiment.

As shown in FIGS. 11 and 12, a synchronizing linkage 1102 is provided between the vertical and horizontal guiding mechanisms 102 in the precision linear nanopositioning stage 100A.

While the present invention has been described with reference to the details of the embodiments of the invention shown in the drawing, these details are not intended to limit the scope of the invention as claimed in the appended claims.

What is claimed is:

1. An deformation compensated flexural pivots structured for a precision linear nanopositioning stage comprising:
   a deformation-compensated flexural linear guiding mechanism including
   a U-shaped member;
   first and second parallel bars;
   a respective pair of I-link bars coupled between said U-shaped member and said respective first parallel bar and second parallel bars; and
   respective pairs of flexural pivots securing each of said I-link bars to said U-shaped member and said respective first parallel bar and said second parallel bar; said flexural pivots being substantially evenly distributed minimizing center shift dynamic errors.

2. The deformation compensated flexural pivots structured for the precision linear nanopositioning stage as recited in claim 1 wherein center shift dynamic errors of each of said flexural pivots are measured and analyzed before assembly in said deformation-compensated flexural linear guiding mechanism.

3. The deformation compensated flexural pivots structured for the precision linear nanopositioning stage as recited in claim 1 wherein each of said flexural pivots are fine tuned before assembly in said deformation-compensated flexural linear guiding mechanism.

4. The deformation compensated flexural pivots structured for the precision linear nanopositioning stage as recited in claim 1 wherein said flexural pivots are selectively paired before assembly in said deformation-compensated flexural linear guiding mechanism.

5. The deformation compensated flexural pivots structured for the precision linear nanopositioning stage as recited in claim 1 includes optimizing of an orientation of each of said flexural pivots before assembly in said deformation-compensated flexural linear guiding mechanism.

6. The deformation compensated flexural pivots structured for the precision linear nanopositioning stage as recited in claim 1 wherein the precision flexural linear stage enables sub-nanometer positioning resolution, high tilting stiffness, and microradian-level straightness of trajectory repeatability.

7. The deformation compensated flexural pivots structured for the precision linear nanopositioning stage as recited in claim 1 wherein the precision flexural linear stage includes three said deformation-compensated flexural linear guiding mechanisms.

8. The deformation compensated flexural pivots structured for the precision linear nanopositioning stage as recited in claim 7 wherein the precision flexural linear stage includes a stage base and a stage carriage, and wherein two of said deformation-compensated flexural linear guiding mechanisms are mounted vertically between said stage base and said stage carriage to provide vertical load capacity for the precision flexural linear stage.

9. The deformation compensated flexural pivots structured for the precision linear nanopositioning stage as recited in claim 8 wherein one said deformation-compensated flexural linear guiding mechanisms links the stage base and the stage carriage horizontally to enhance linear guiding and provide lateral stiffness for the precision flexural linear stage.

10. The deformation compensated flexural pivots structured for the precision linear nanopositioning stage as recited in claim 7 includes a synchronizing linkage provided between said U-shaped member of said two of said deformation-compensated flexural linear guiding mechanisms mounted vertically between said stage base and said stage carriage.

11. The deformation compensated flexural pivots structured for the precision linear nanopositioning stage as recited in claim 7 includes synchronizing linkages provided between said U-shaped member of said three said deformation-compensated flexural linear guiding mechanisms.

12. The deformation compensated flexural pivots structured for the precision linear nanopositioning stage as recited in claim 1 wherein the precision flexural linear stage includes a stage base and a piezoelectric transducer (PZT)-based nanopositioning motor mounted on said stage base.

13. The deformation compensated flexural pivots structured for the precision linear nanopositioning stage as recited in claim 12 wherein the said PZT motor provides 12-mm travel range with 100-nm resolution.

14. The deformation compensated flexural pivots structured for the precision linear nanopositioning stage as recited in claim 1 wherein the precision flexural linear stage includes a stage base and a stage carriage and a piezoelectric transducer (PZT)-based nanopositioning actuator.

15. The deformation compensated flexural pivots structured for the precision linear nanopositioning stage as recited in claim 14 wherein said PZT actuator drives the stage with sub-nanometer positioning resolution in a 15-micron travel range.

16. The deformation compensated flexural pivots structured for the precision linear nanopositioning stage as recited in claim 1 wherein the precision flexural linear stage includes a stage base, a stage carriage, a piezoelectric transducer (PZT)-based nanopositioning motor mounted on said stage base, a PZT actuator, and a set of compression springs providing a preloading force between said PZT motor and said PZT actuator to minimize the motion backlash.

17. The deformation compensated flexural pivots structured for the precision linear nanopositioning stage as recited in claim 1 wherein the precision flexural linear stage includes a stage base and a stage carriage, and includes an optical encoder measuring a stage carriage position related to said stage base.

18. A method for implementing deformation compensated flexural pivots structured for a precision linear nanopositioning stage comprising:
   providing a deformation-compensated flexural linear guiding mechanism including a U-shaped member; first and second parallel bars; a respective pair of I-link bars coupled between said U-shaped member and said respective first parallel bar and second parallel bar; and respective pairs of flexural pivots securing each of said I-link bars to said U-shaped member and said respective first parallel bar and said second parallel bar; and
   providing said flexural pivots substantially evenly distributed minimizing center shift dynamic errors.

19. The method as recited in claim 18 wherein providing said flexural pivots includes analyzing center shift dynamic errors of each of said flexural pivots.

20. The method as recited in claim 19 includes fine tuning of each of said flexural pivots, pairing of said flexural pivots, and optimizing of an orientation of each of said flexural pivots.

\* \* \* \* \*